United States Patent
Wang et al.

(10) Patent No.: US 6,847,015 B2
(45) Date of Patent: Jan. 25, 2005

(54) HEAT TREATMENT APPARATUS AND CONTROLLER FOR HEAT TREATMENT APPARATUS AND CONTROL METHOD FOR HEAT TREATMENT APPARATUS

(75) Inventors: Wenling Wang, Shiroyama-Machi (JP); Koichi Sakamoto, Shiroyama-Machi (JP); Youngchul Park, Shiroyama-Machi (JP); Fujio Suzuki, Shiroyama-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 245 days.

(21) Appl. No.: 09/963,381

(22) Filed: Sep. 27, 2001

(65) Prior Publication Data

US 2002/0074324 A1 Jun. 20, 2002

(30) Foreign Application Priority Data

Sep. 27, 2000 (JP) .................................... 2000-295262

(51) Int. Cl.$^7$ ............................................... H05B 3/02
(52) U.S. Cl. ..................... 219/486; 219/494; 219/506
(58) Field of Search ................................ 219/496, 483, 219/486, 497, 492, 494, 425, 505, 501, 506; 392/416

(56) References Cited

U.S. PATENT DOCUMENTS

| 5,517,594 | A | | 5/1996 | Shah et al. ................. 392/416 |
| 5,895,596 | A | * | 4/1999 | Stoddard et al. ............ 219/497 |
| 6,060,697 | A | * | 5/2000 | Morita et al. ............... 219/483 |
| 6,175,103 | B1 | * | 1/2001 | Lam et al. .................. 219/506 |

FOREIGN PATENT DOCUMENTS

| JP | 09/007963 | 1/1997 |
| JP | 10/335340 | 12/1998 |
| JP | 2000/29526 | 1/2000 |
| JP | 2000/077345 | 3/2000 |

* cited by examiner

*Primary Examiner*—Tu Hoang
(74) *Attorney, Agent, or Firm*—Smith, Gambrell & Russell, LLP

(57) ABSTRACT

Temperature control is made without the risk of contaminating object-to-be-processed and with high accuracy. Temperatures are metered out of contact with the objects-to-be-processed, and based on a metered result, estimated temperatures of the objects-to-be-processed are computed. Furthermore, estimation errors of the estimated temperatures are computed to correct the estimated temperatures. Based on a temperature recipe stating relationships between set temperatures and times and the corrected estimated temperatures, a heater is controlled.

24 Claims, 5 Drawing Sheets

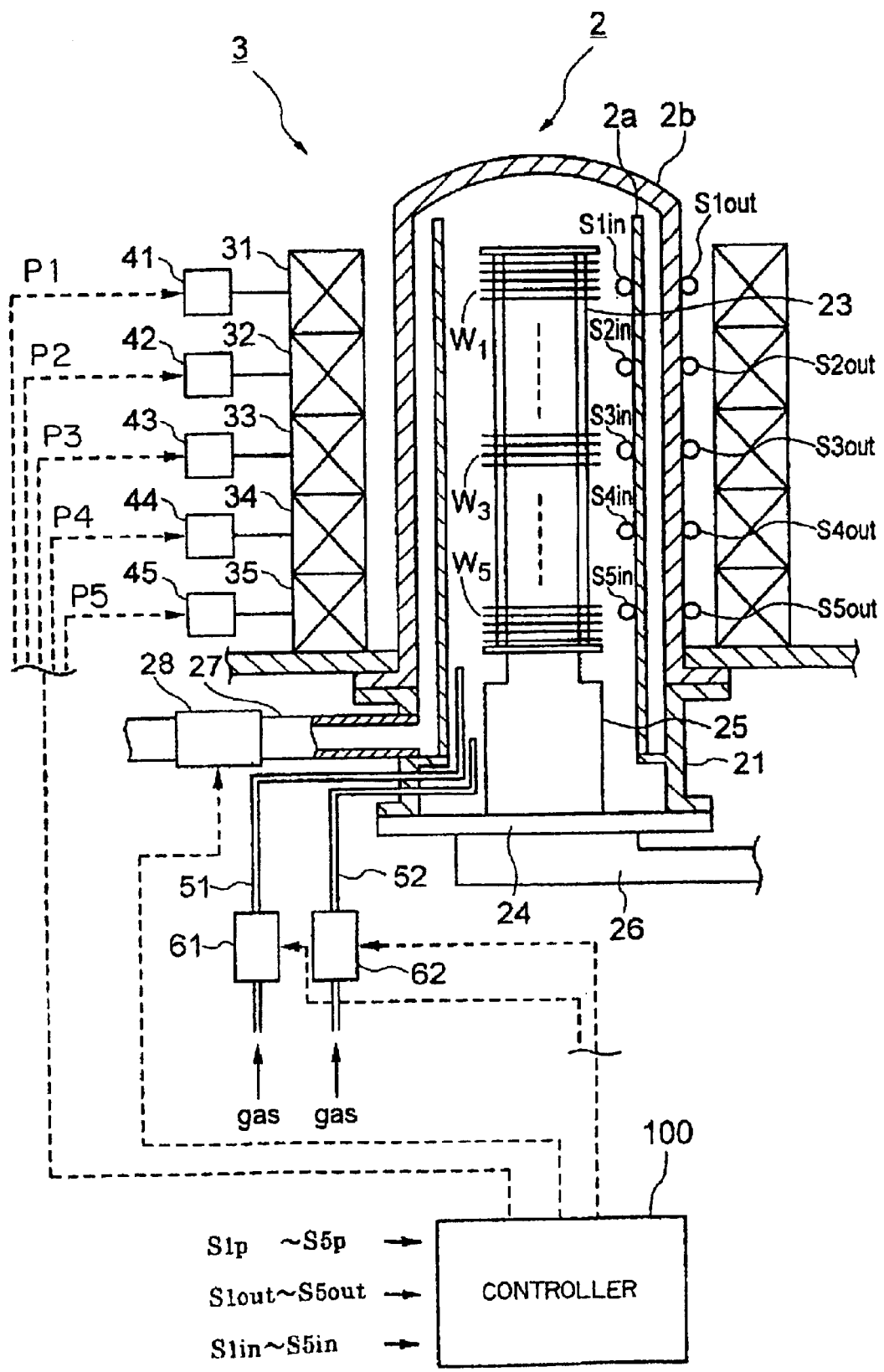
F I G. 1

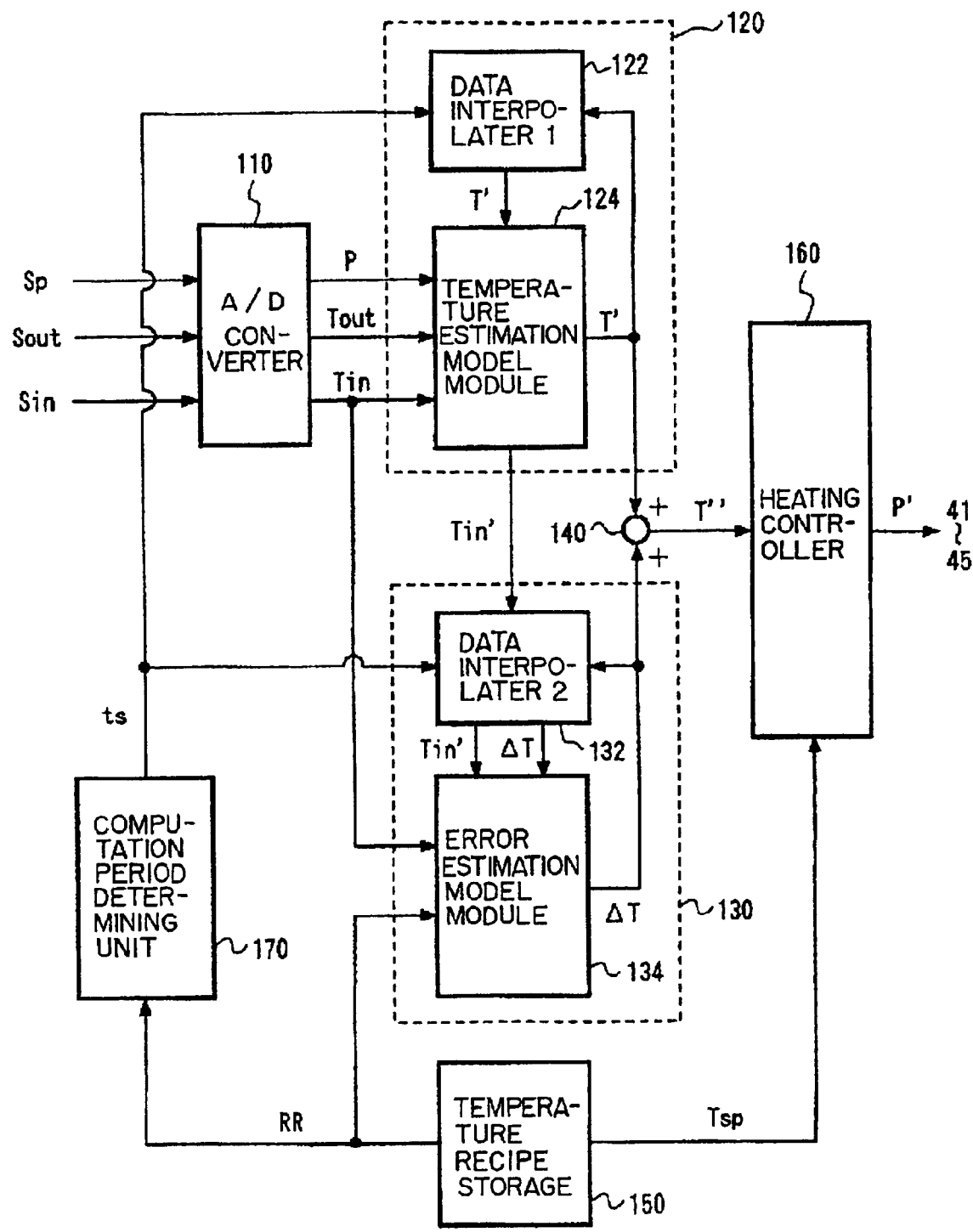
F I G. 3

| TIME (min) | SET TEMPERATURE (°C)<br>(Set Point) | CHANGE RATE OF SET TEMPERATURE (°C/min)<br>(Ramp Rate) |
|---|---|---|
| t0~t1 | 300 | 0 |
| t1~t2 | 300~310 | 10 |
| t2~t3 | 310~350 | 20 |
| t3~t4 | 350~400 | 50 |
| t4~t5 | 400~500 | 100 |
| t5~t6 | 500 | 0 |
| t6~t7 | 500~400 | -100 |
| t7~t8 | 400~350 | -50 |
| t8~t9 | 350~300 | -10 |
| t9~ | 300 | 0 |
F I G. 5
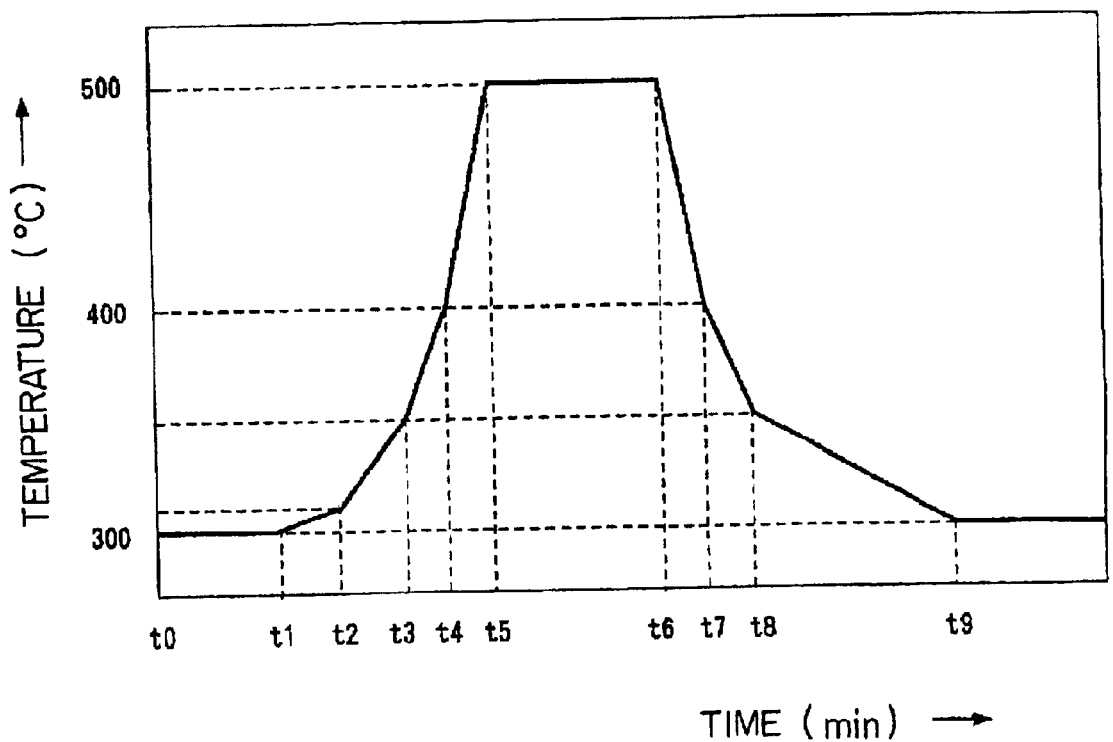
F I G. 6

HEAT TREATMENT APPARATUS AND CONTROLLER FOR HEAT TREATMENT APPARATUS AND CONTROL METHOD FOR HEAT TREATMENT APPARATUS

CROSS REFERENCE TO RELATED APPLICATIONS

The subject application is related to subject matter disclosed in Japanese Patent Application No. 2000-29526 filed on Sep. 27, 2000 in Japan to which the subject application claims priority under Paris Convention and which is incorporated herein by reference.

BACKGROUND OF THE INVENTION

1. Field of the Invention

The present invention relates to a heat treatment apparatus, a controller for the heat treatment apparatus and a method for controlling the heat treatment apparatus, more specifically to a heat treatment apparatus in which temperatures of objects-to-be-processed can be incontiguously estimated, and a controller for the heat treatment apparatus and a method for controlling the heat treatment apparatus.

2. Related Background Art

One apparatus for making heat treatments on objects-to-be-processed, such as semiconductor wafers (hereinafter called wafers) or others, which is used in semiconductor device fabrication methods is a vertical heat treatment apparatus for batch treatment. In this vertical heat treatment apparatus, a number of wafers are held horizontally in a shelves-like manner on a holder, such as wafer boat or others, and the holder is loaded in the vertical heat treatment apparatus for a heat treatment, e.g., CVD (Chemical Vapor Deposition), oxidation, etc.

To make a heat treatment on the wafers it is necessary to precisely control temperatures of the wafers. For example, in forming a thin film on the wafers by, e.g., CVD, a film thickness of the thin film depends on temperatures of the wafers. Accordingly, the temperature control of the heat treatment apparatus must be performed with high accuracy.

The heat control has been conventionally made by loading the wafers with thermocouples into the heat treatment apparatus to meter temperatures of the wafers.

However, when the wafers with thermocouples are loaded in the heat treatment apparatus, there is a risk that the metal forming the thermocouples disperses in the heat treatment apparatus and stays on the inside of the heat treatment apparatus, with a result that the staying metal adheres to the wafers, causing metal contamination.

SUMMARY OF THE INVENTION

The present invention was made in view of the above circumstances, and an object of the present invention is to provide a heat treatment apparatus, a controller for the heat treatment apparatus and a method for controlling the heat treatment apparatus which are free from the risk of contamination of objects-to-be-processed and can control temperatures with high accuracy.

(1) To attain the above-described object, the heat treatment apparatus according to the present invention comprises: a heater for heating an object-to-be-processed; a temperature meter disposed in the heater; a temperature estimator for computing an estimated temperature of the object-to-be-processed, based on a temperature metered result of the temperature meter; an error estimator for computing an estimation error of the estimated temperature computed by the temperature estimator; a temperature corrector for computing a corrected estimated temperature given by correcting the estimated temperature computed by the temperature estimator, based on the estimation error computed by the error estimator; and a heating controller for controlling the heater, based on the corrected estimated temperature computed by the temperature corrector, and a temperature recipe stating a relationship between a set temperature and a time.

The temperature meter disposed in the heater meters temperatures, and, based on a temperature metered result, a temperature of the object-to-be-processed are estimated. The estimated temperatures are corrected, based on estimation errors. Consequently, a temperature of the object-to-be-processed can be accurately estimated.

(2) The controller for controlling a heat treatment apparatus according to the present invention comprising a heater for heating an object-to-be-processed, and temperature meter disposed in the heater comprises a temperature estimator for computing an estimated temperature of the object-to-be-processed, based on a temperature metering result of the temperature meter; an error estimator for computing an estimation error of the estimated temperature computed by the temperature estimator; a temperature corrector for computing a corrected estimated temperature given by correcting the estimated temperature computed by the temperature estimator, based on the estimation error computed by the error estimator; and a heating controller for controlling the heater, based on the corrected estimated temperature computed by the temperature corrector.

(3) The controller for controlling a heat treatment apparatus comprising a heater for heating an object-to-be-processed comprises a heating controller for controlling the heater in accordance with a temperature recipe stating a relationship between a set temperature and a time; and a control period determining unit for determining a control period for periodically controlling the heater by the heating controller, based on a change rate of the set temperature.

Periods of the control are changed, based on change rates of a set temperature, whereby both accuracy and efficiency of the control can be considered.

(4) The method for controlling a heat treatment apparatus comprising a heater for heating an object-to-be-processed comprises a temperature metering step of metering a temperature in the heater; a temperature estimating step of computing an estimated temperature of the object-to-be-processed, based on a temperature metering result of the temperature metering step; an error estimating step of computing an estimation error of the estimated temperature computed in the temperature estimating step; a temperature correcting step of computing a corrected estimated temperature given by correcting the estimated temperature computed in the temperature estimating step, based on the estimation error computed in the error estimation step; and a heating control step for controlling the heater, based on the corrected estimated temperature computed in the temperature correcting step, and a temperature recipe stating a relation ship between a set temperature and a time.

The temperature meter disposed in the heater meters temperatures, and, based on temperature metered results, temperatures of the object-to-be-processed are estimated, and the estimated temperatures are corrected based on estimation errors. The heater is controlled, based on the corrected estimated temperatures. Consequently, the heater can be controlled based on the estimated temperatures of the object-to-be-processed computed with good accuracy.

(5) The method for controlling a heat treatment apparatus comprises a heating control step of controlling the heater in accordance with a temperature recipe stating a relationship between a set temperature and a time; and a control period determining step of determining a control period for periodically controlling the heater by the heating control step, based on a change rate of the set temperature.

Periods of the control are changed, based on change rates of a set temperature, whereby both accuracy and efficiency of the control can be considered.

BRIEF DESCRIPTION OF THE DRAWINGS

FIG. 1 is a partial sectional view of the heat treatment apparatus according to the present invention, which shows a structure thereof.

FIG. 3 is a block diagram of the controller of the heat treatment apparatus according to the present invention.

FIG. 5 is a table which is one example of the temperature recipe.

FIG. 6 is a graph which is another example of the temperature recipe.

DESCRIPTION OF THE PREFERRED EMBODIMENTS (A First Embodiment)

The vertical heat treatment apparatus according to a first embodiment of the present invention will be explained.

Figure 2:
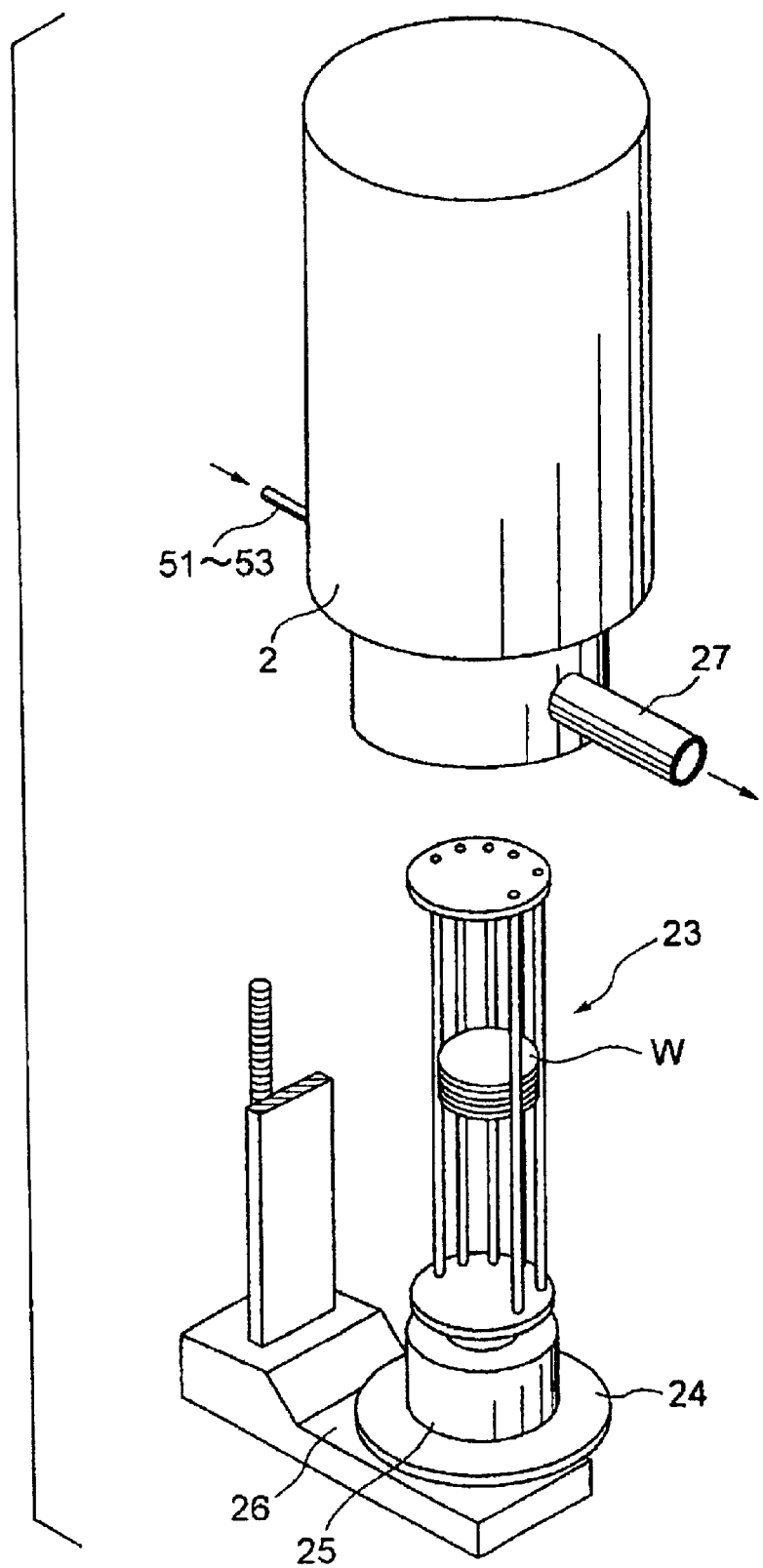
FIG. 2 is perspective views of the heat treatment apparatus according to the present invention, which show the structure thereof.

FIGS. 1 and 2 are respectively a partial sectional view and perspective views of the vertical heat treatment apparatus according to the present embodiment.

The vertical heat treatment apparatus according to the present embodiment comprises a reaction tube 2 of the double-tube structure of an inner tube 2a and an outer tube 2b which are formed of, e.g., quartz, and a cylindrical manifold 21 of metal disposed on the bottom of the reaction tube 2.

The inner tube 2a has the top uninterrupted and is supported on the inside of the manifold 21. The outer tube 2b has the top interrupted and has the lower end connected air-tightly to the upper end of the manifold 21 below a base plate 22.

As shown in FIG. 2, in the reaction tube 2, a number of objects-to-be-processed, semiconductor wafers W are held on a holder, a wafer boat 23 horizontally and vertically spaced from each other in a shelves-like manner. The wafer boat 23 is retained on a lid 24 through a heat insulation cylinder (heat insulator) 25.

A heater 3 for heating the wafers W, objects-to-be-processed is disposed around the reaction tube 2, and the heater 3 is in the form of, e.g., resistance heaters. The heater 3 is divided in zone 1 to zone 5. The respective heaters 31–35 can have calories controlled independent of each other. Electric power controllers 41–45 have respective electric power sensors S1p–S5p for metering thermal powers of the respective heaters 31–35.

Inside temperature sensors S1in–S5in in the form of thermocouples or others as an objects-to-be-processed vicinity temperature meters are disposed on the inside wall of the inner tube 2a corresponding to the zones 1–5 of the respective heaters 1–5. Outside temperature sensors S1out–S5out in the form of thermocouples or others as a heater vicinity temperature meters are disposed on the outside wall of the outer tube 2b corresponding to the zones 1–5 of the respective heaters 31–35.

Monitor wafers W1–W5 are mounted at positions corresponding to the zones 1–5 of the respective heaters 31–35. As will be described later, temperatures of the monitor wafers W1–W5 are estimated, based on metered signals of the temperature sensors Sin (S1in–S5in), Sout (S1out–S5out) and the electric power sensors Sp(S1p–S5p).

The manifold 21 has a plurality of gas feed pipes for feeding gases into the inner tube 2a. In FIG. 1, two gas feed pipes 51, 52 are shown for the convenience of the description. Flow rate controllers 61, 62, such as mass flow controllers or others, for controlling respective gas flow rates, and valves (not shown) are inserted in the gas feed pipes 51, 52.

The manifold 21 is connected to an exhaust pipe 27 for exhausting the gases through a gap between the inner tube 2a and the outer tube 2b. The exhaust pipe 27 is connected to a vacuum pump. A pressure adjuster 28 including a butterfly valve and a valve operator, for adjusting pressures in the reaction tube 2 is inserted in the exhaust pipe 27.

The vertical heat treatment apparatus comprises a controller 100 for controlling treatment parameters, such as temperatures of a treatment atmosphere in the reaction tube 2, pressures in the reaction tube 2 and gas flow rates. The controller 100 receives metered signals of the electric power sensors Sp (S1p–S5p) and the temperature sensors Sin (S1in–S5in), Sout (S1out–S5out) and outputs control signals to the electric power controllers 41–45 of the heater 3, a pressure adjuster 28 and flow rate adjusters 61, 62.

Then, the controller 100 will be described in good detail.

FIG. 3 is a block diagram of a part of an internal structure of the controller 100, which is involved in the control of the heater 3.

As shown in FIG. 3, the controller 100 comprises an A/D (Analog/Digital) converter 110 which converts analog metered signals of the electric power sensors Sp and the temperature sensors Sout, Sin to digital metered signal; a temperature estimator 120 which computes estimated temperatures of wafers; an error estimator 130 which computes estimation errors ΔT of the wafer estimated temperatures T' computed by the temperature estimator 120; an adder 140 as a temperature corrector which adds the computed estimated temperatures T' and the estimation errors ΔT to each other to compute corrected estimated temperatures T''' of the wafers; a temperature recipe storage 150 which stores a temperature recipe stating relationships between set temperatures and times for a heat treatment of the wafers; a heating controller 160 which outputs electric power control signals P' to the electric power controllers 41–45, based on the corrected estimated temperatures T''' and the set temperatures Tsp set on the temperature recipe stored in the temperature recipe storage 150; and a computation period determining unit which determines a computation period ts for the computation of the temperature estimator 120 and the error estimator 130.

The temperature estimator 120 includes a first data interpolator 122 for interpolating data necessary to compute estimated temperatures T' of the wafers W corresponding to a computation period ts, and a temperature estimation model module 124 which computes estimated temperatures T' of the wafers. The error estimator 130 includes a second data interpolator 132 which interpolates data necessary to compute estimation errors ΔT of the estimated temperatures of the wafers W, and an error estimation model module 134 which computes estimation errors ΔT of the estimated temperatures of the wafers.

Figure 4:
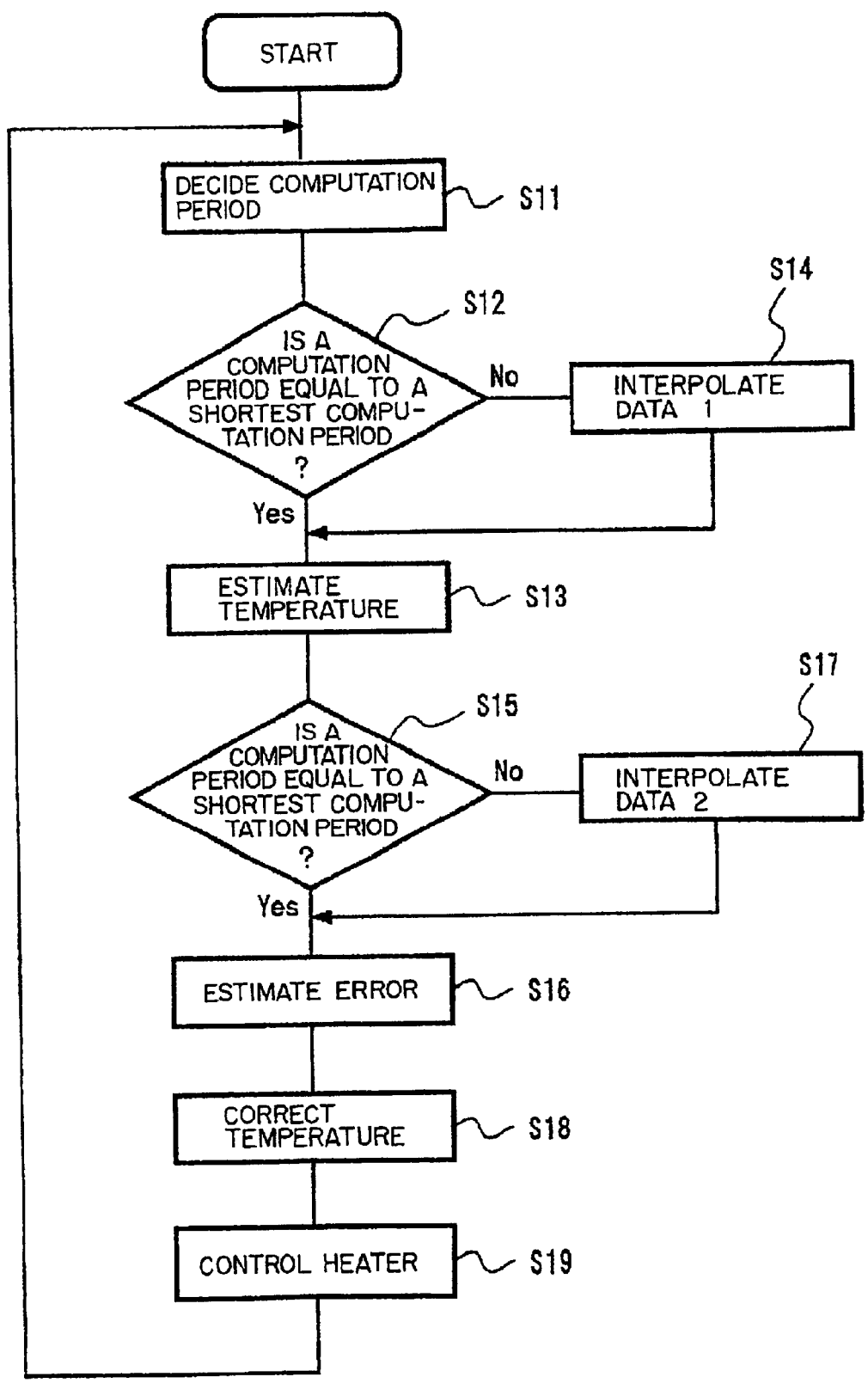
FIG. 4 is a flow chart of a control procedure of the controller.

FIG. 4 is a flow chart of a control procedure of controlling the heater 3. The procedure of the temperature control will be explained with reference to FIG. 4.

(A) The computation period determining unit 170 determines a computation period ts, based on a change ratio RR of a set temperature Tsp stated in a temperature recipe stored in the temperature recipe storage 150 (S11).

A computation period ts is set corresponding to a change ratio RR of a set temperature, i.e., a change ratio of a wafer temperature, whereby the computing and the control devices can be effectively used. That is, when a change ratio RR of a set temperature Tsp is small, a computation interval can be large, which allows the computing or control elements, such as CPU (Central Processing Unit) not shown to be used for other processing. On the other hand, when a change ratio RR of a set temperature is large, estimated temperatures, etc. of the wafers are computed by a short computation period, and temperatures of the wafers can be accordingly precisely controlled.

The temperature recipe stored in the temperature recipe storage 150 shows relationships between set temperatures Tsp, i.e., target temperatures of a heat treatment for the wafers W, and time. FIGS. 5 and 6 show examples of the temperature recipe.

FIG. 5 shows a table expressing set temperatures Tsp (Set Point) and change rate RR of the set temperatures Tsp corresponding to sections of a time. FIG. 6 is a graph expressing the set temperatures Tsp and the sections of a time.

FIGS. 5 and 6 are different from each other in the forms and express the same temperature recipe. From a time t0 to a time t1, a set temperature is kept constant at 300° C., and from a time t1 to a time t2, the set temperature Tsp changes from 300° C. to 310° C. at a 10° C./min change rate. From a time t2 to a time t3, the set temperature Tsp changes respectively from 310° C. to 350° C., from 350° C. to 400° C. and from 400° to 500° C. respectively at a 20° C./min change rate RR, a 50° C./min change rate RR and a 100° C./min change rate RR. From a time t5 to a time t6, the set temperature is kept constant at 500° C. From a time t6 to a time t7, from a time t7 to a time t8 and from a time t8 to a time t9, the set temperatures lower respectively from 500° C. to 400° C., from 400° C. to 350° C. and from 350° C. to 300° C. respectively at a −100° C./min change rate, a −50° C./min change rate and a −10° C./min change rate. From a time t9 later, the set temperature is kept constant at 300° C.

FIGS. 5 and 6 are substantially the same, and either of the forms may be used in practicing the present invention. In other words, the temperature recipe may be expressed in any form which can give set temperatures Tsp and change rates RR of the set temperatures corresponding to times.

Based on change rates RR of set temperatures, computation periods ts are determined. One example of the method for determining set temperatures is expressed by the following formulae (1) to (4).

$$ts=0.5[sec](|RR|\geq 50[°\ C./min]) \quad (1)$$

$$ts=1.0[sec](25\leq |RR|<50[°\ C./min]) \quad (2)$$

$$ts=2.0[sec](20\leq |RR|<25[°\ C./min]) \quad (3)$$

$$ts=4.0[sec](0\leq |RR|<10[°\ C./min]) \quad (4)$$

Formula (1) gives a shortest computation period Δt=0.5 sec when a change rate RR of a set temperature is above 50° C./min including 50° C./min. The computation period ts changes from 0.5 sec to 4.0 sec, becoming smaller as a change rate of an absolute value of a set temperature becomes larger.

In the example shown by Formulae (1) to (4), computation periods ts have values given by multiplying a shortest computation period by powers of 2. However, a computation period ts may be integer times a shortest computation period Δt.

(B) The data interpolator 122 judges whether or not a computation period ts is equal to a shortest computation period Δt (S12).

When the judgement is YES, the temperature estimation model module 124 computes an estimated temperatures T' of the wafers (S13). When the judgement is NO in S12, the data interpolator 122 interpolates data necessary for the computation of the temperature estimation (S14). The temperature estimation model module 124 computes an estimated temperature T' (S13).

To compute an estimated temperatures T of the wafers, digital signal outputs of the A/D converter 110, which include wafer vicinity temperatures Tin (T1in–T5in), heater vicinity temperatures Tout (T1out–T5out) and heat powers of the haters (P1–P5) (control signals of the controller 100 for the electric power controllers 41–45), are used. The A/D converter 110 periodically converts analog signal inputs to digital signal outputs to output the digital signals. To effectively use the computing and control devices including the A/D converter 110 it is preferable that a sampling interval agrees with a shortest computation period Δt.

1) Here, the temperature estimation in S13 will be detailed.

Here, estimated wafer temperatures T' (estimated central temperatures Tc' (Tc1'–Tc5') in a vicinity of the centers of the wafers), estimated edge temperatures Te' in a vicinity of the edges of the wafers (Te1'–Te5') and estimated wafer vicinity temperatures Tin' (Tin1'–Tin5') are calculated, based on wafer vicinity temperatures Tin, heater vicinity temperatures Tout and heat powers of the haters (P1–P5) (control signals of the controller 100 for the electric power controllers 41–45). The subscripts 1 to 5 correspond respectively to zones 1 to 5.

$$y(k)=-a1\cdot y$$

$$(k-1)-a2\cdot y$$

$$(k-2)-a3\cdot y$$

$$(k-3)-\ldots -ai\cdot y$$

$$(k-i)-\ldots -a16\cdot y$$

$$(k-16)+b1\cdot u$$

$$(k-1)+b2\cdot u$$

$$(k-2)+b3\cdot u$$

$$(k-3)+\ldots +bi\cdot u$$

$$(k-i)+\ldots +b16\cdot u$$

$$(k-16)+w(k)+tm \quad (5)$$

wherein y(k) is an output vector after one period (Δt[sec] later); y(k−1) is a current output vector; y(k−i) is an output vector before (i−1) period (before (i−1)·Δt[sec]); u(k−1) is a current input vector; u(k−i) is an input vector before (i−1) period (before (i−1)·Δt[sec]), and w(k) is a noise vector (white noise).

Vectors u(k−i), y(k−i) and w(k) are specifically expressed by the following formulae (6) to (8).

$$u(k-i) = \quad (6)$$
$$(P1, P2, \ldots, P5, T1out, T2out, \ldots, T6out, T1in, T2in, \ldots, T5in)$$

$$y(k-i) = (T1c', T2c', \ldots, T5c', \quad (7)$$
$$T1e', T2e', \ldots, T5e', T1in', T2in', \ldots, T5in')$$

$$w(k)=(w1(k), w2(k), \ldots, w15(k)) \quad (8)$$

Formula (5) is a 16 dimension-parametric model, and computes an output vector y(k) after one period, based on a current and a past input vectors u(k−i) and a current and a past output vectors y(k−i).

An output vector y(k) after one period is used as a current value y(k−1) of an output vector upon the next computation (at which 1 is added to k). When an input vector u(k−1) is known, an output vector y(k) after one period can be sequentially computed.

That is, estimated wafer central temperatures Tc' (T1c'−T5c'), estimated wafer edge temperatures Te' (T1e'−T5e') and estimated wafer vicinity temperatures Tin' (T1in'−T5in') can be computed based on heat powers P (P1−P5) of the haters, heater vicinity temperatures Tout (T1out−T5out) and wafer vicinity temperatures Tin (T1in−T5in).

The estimated wafer vicinity temperatures Tin' are computed for the error estimation in the later step S16. When the error estimation is unnecessary, the output vector y(k−i) may not include an estimated wafer vicinity temperatures Tin' as in the following Formula (9).

$$y(k-i) = (T1c', T2c', \ldots, T5c' \quad (9)$$
$$T1e, T2e, \ldots, T5e)$$

In this case, both estimated wafer temperatures T' and estimated wafer vicinity temperatures Tin' are computed by one model but may be computed respectively by respective models. For example, estimated wafer temperatures T' are computed by a model using the following formulae (10) to (13), and estimated wafer vicinity temperatures Tin' are computed by a model using the following formulae (14) to (17).

$$y1(k) = -a11 \cdot y1(k-1) - a12 \cdot y1(k-2) - \quad (10)$$
$$\cdots - a1i \cdot y1(k-i) - \cdots - a116 \cdot y1(k-16) +$$
$$b11 \cdot u1(k-1) + b12 \cdot u1(k-2) +$$
$$\cdots b1i \cdot u1(k-i) + \cdots + b116 \cdot u1(k-16) +$$
$$w1k$$

$$u1(k-i) = (P1, \ldots, P5, \quad (11)$$
$$T1out, \ldots, T5out,$$
$$T1in, \ldots, T5in)$$

$$y1(k-i) = (T1c', \ldots, T5c', \quad (12)$$
$$T1e', \ldots, T5e')$$

$$w1(k)=(w11(k), \ldots, w116(k)) \quad (13)$$

$$y2(k) = -a21 \cdot y2(k-1) - a22 \cdot y2(k-2) - \quad (14)$$
$$\cdots - a2i \cdot y2(k-i) - \cdots - a216 \cdot y2(k-16) +$$
$$b21 \cdot u2(k-1) + b22 \cdot u2(k-2) +$$
$$\cdots + b2i \cdot u2(k-i) + \cdots + b216 \cdot u2(k-16) +$$
$$w2(k)$$

$$u2(k-i) = (P1, \ldots, P5, \quad (15)$$
$$T1out, \ldots, T5out)$$

$$y2(k-i)=T1in', \ldots, T5in') \quad (16)$$
$$w2(k)=(w21(k), \ldots, w216(k)) \quad (17)$$

Parameters a1−a16, b1−b16 of Formula (5) and etc. and a noise vector w(k) are determined in advance before an output vector y(k) is computed.

To determine parameters a1−a16, b1−b16, a noise vector w(k), subspace method or Auto-Regressive Exogeneous Model (hereinafter called ARX model) can be used.

Specifically, data, such as metered signals of the temperature sensors S1in−S5in, s1out−S5out and real metered temperatures of the monitor wafers W1−W5 (temperature sensors, such as thermocouples are mounted on the monitor wafers) are inputted to, e.g. software Matlab (produced by The Math Works, Inc., marketed by Cybernet System Kabushiki Kaisha) to inversely compute the parameters a1−a16, b1−b16, and the noise vector w(k).

A plurality of combinations of the given parameters a1−a16, b1−b16 and the noise vector w(k) are usually available. Out of the plural combinations, one in which the estimated temperatures T1'−T5' given by Formula (5) well agree with the actually metered temperatures of the monitor wafers is selected (Model appreciation).

Dimensions of the model are usually large, and dimensions are suitably reduced to make the model of 16 dimensions.

2) Next, the data interpolating step (S14) will be explained.

When a computation period ts is equal to a shortest computation period Δt, a value of the output vector y(k−1) computed before can be substituted as it is into Formula (5). However, when a computation period ts is different from (larger than) the shortest computation period Δt, the data is insufficient to be substituted as it is into Formula (5) or others. Then, the data must be interpolated.

Here, it is assumed that a computation period ts is n-times a shortest computation period: t (ts=n·Δt). In this case, the computation of an output vector y(k) by Formula (5) is performed every n-shortest computation periods. That is, only when k=n·m in Formula (5), the computation is performed (m: an integer).

When n=4, for example, k is given by Formula (18). The data of the output vector with, e.g., k=1 to 3 and 5 to 7 must be interpolated.

$$k=0, 4, 8, 12, 16, \ldots \qquad (18)$$

In Formula (5), when k=n·m, an output vector y(k) computed immediately before is k=n·(m−1), and an output vector y(k) computed next immediately before is k=n·(m−2). In such case, the following interpolation is performed.

(1) Data interpolation between k=n·m and k=n·(m−1)

First, an interpolation for an output vector between k=n·m and k=n·(m−1) will be explained. Output vectors y(k) for k=(n·m−1), (n·m−2), ..., (n·(m−1)+1) must be given. All the output vectors can have a value of the immediately before computed output vector (n·(m−1)) as expressed by the following Formula (19).

$$y(n \cdot m - 1) = y(n \cdot (m-1)) \qquad (19)$$
$$y(n \cdot m - 2) = y(n \cdot (m-1))$$
$$\overline{y(n \cdot (m-1)+1) = y(n \cdot (m-1))}$$

(2) Data interpolation between k=n·(m−1) and k=n·(m−2) output vectors

An output vector between k=n·(m−1) and k=n·(m−2) can be an interpolated value between an output vector y(n·(m−1)) computed immediately before and an output vector y(n·(m−2)) computed next immediately before. As exemplified by the following Formula (20), the interpolation can use linear approximation between the immediately before output vector y(n·(m−1)) and the next immediately before output vector y(n·(m−2)).

$$y(n \cdot (m-1) - 1) = \frac{[1 \cdot y(n \cdot (m-2)) + (n-1) \cdot y(n \cdot (m-1))]/n}{y(n \cdot (m-1) - i)} \qquad (20)$$
$$= \frac{[i \cdot y(n \cdot (m-2)) + (n-i) \cdot y(n \cdot (m-1))]/n}{y(n \cdot (m-2) + 1)}$$
$$= [(n-1) \cdot y(n \cdot (m-2)) + 1 \cdot y(n \cdot (m-1))]/n$$

As the interpolation, various interpolations, such as parabolic approximation beside the linear approximation expressed by Formula (20) can be used.

The data interpolation between k=n·m and k=n·(m−1) can be made by interpolations besides the interpolation expressed by Formula (19) (a computed value of an output vector y(k) computed immediately before). For example, extrapolation maybe used, based on a value of an output vector computed immediately before and a value of an output vector next immediately before.

The following Formula (21) exemplifies linear extrapolation using values of output vectors computed immediately before and next immediately before.

$$y(n \cdot (m-1)) = [(2n-1) \cdot y(n \cdot (m-1)) - (n-1) \cdot y(n \cdot (m-2))]/n \qquad (21)$$
$$y(n \cdot (m-1) + i) = [(n+i) \cdot y(n \cdot (m-1)) - i \cdot y(n \cdot (m-2))]/n$$
$$y(n \cdot (m-1) + 1 = [(n+1) \cdot y(n \cdot (m-1)) - 1 \cdot y(n \cdot (m-2))]/n$$

(3) Data interpolation before k=n·(m−2)

A value of an output vector y(k−i) before k=n·(m−2) may be value of the value of the output vector y(k−i) used in computing the output vector y(k) immediately before.

Data are thus interpolated by using Formulae (20) and (21) for the temperature estimation.

In the above-described interpolation, when a computation period is switched from a shorter computation period to a longer computation period, an output vector y(k−i) computed in the shorter computation period can be used in the computation of Formula (5) early after the switch of the computation period. In short, when a suitable value of the output vector y(k−i) is available, the value is used, and when a suitable value is unavailable, the interpolation is performed by an interpolation or an extrapolation to give a current or a past output vector.

(C) It is judged whether or not a computed period is equal to a shortest computation period (S15), and when the judgement is YES, estimation errors ΔT of wafer temperatures are computed (S16). When the judgement in S15 is NO, data necessary for the computation of the temperature estimation are interpolated (S17), and then estimation errors ΔT are computed (16).

The error estimation in S15 will be detailed.

The error estimation is for estimating differences between values of estimated wafer temperatures T' (Tc', ..., Te') and actually metered temperatures T (Tc, ..., Te). That is, idealistically, estimation errors ΔT (central estimation errors ΔTc in a vicinity of the centers of the wafers and edge estimation errors ΔTe) are expressed by the following Formula (22).

$$\Delta T = T - T' \qquad (22)$$

Actual temperatures T of the wafers are not actually metered, and estimation errors ΔT of the wafers must be estimated, based on relationships with other parameters. As such parameter, estimated wafer vicinity temperatures Tin' and actually metered wafer vicinity temperatures Tin can be used. Here, an estimated wafer vicinity estimation error ΔTin can be given by the following Formula (23).

$$\Delta Tin = Tin - Tin' \qquad (23)$$

It is considered that temperatures of the wafers themselves and temperatures in the vicinity of the wafers have close relationships with each other. Empirically, estimation errors ΔT have values related with vicinity estimation errors ΔTin. Accordingly, a model is prepared to thereby compute estimation errors ΔT of the wafers, based on vicinity estimation errors ΔTin. Change rates RR of set temperatures have close relationship with estimation errors ΔT of the wafers, and are taken into consideration.

Finally, estimation errors ΔT of the wafers are computed, based on vicinity estimation errors ΔTin and change rates RR of set temperatures.

To compute estimation errors in S16, a parameter model expressed by the following Formula (24) which is substantially the same as Formula (5) can be used.

$$y(k) = -a1 \cdot y(k-1) - a2 \cdot y(k-2) - a3 \cdot y(k-3) - \cdots - \qquad (24)$$
$$ai \cdot y(k-i) - \cdots - a16 \cdot y(k-16) + b1 \cdot u(k-1) + b2 \cdot u(k-2) +$$
$$b3 \cdot u(k-3) + \cdots + bi \cdot u(k-i) + \cdots + b16 \cdot u(k-16) + \Delta w(k)$$

wherein y(k) is an output vector after one period (Δt[sec] later); y(k−1) is a current output vector; y(k−i) is an output vector before (i−1) period ((i−1)·Δt[sec] before); u(k−1) is a current input vector; u(k−i) is an input vector before (i−1) period ((i−1)·Δt[sec]); and w(k) is a noise vector (white noise), which are substantially the same as those in Formula (5).

However, vectors u(k−i), y(k−i) and w(k) are specifically expressed by the following Formulae (25) to (27), which are different from those of Formula (5).

$$u(k-i)=(\Delta T1in, \Delta T2in, \ldots, \Delta T5in, RR) \quad (25)$$

$$y(k-i)=(\Delta T1c, \Delta T2c, \ldots, \Delta T5c, \Delta T1e, \Delta T2e, \ldots, \Delta T5e) \quad (26)$$

$$\Delta w(k)=(\Delta w1(k), \ldots, \Delta w15(k)) \quad (27)$$

Formula (24) is a 16 dimension-parametric model, as is Formula (5). When an input vector is known, an output vector y(k) after one period can be sequentially computed. For this computation, parameters a0–a15, b0–b15, and a noise vector Δw(k) can be determined by subspace method or ARX model, as can be used in Formula (5).

The data interpolating step (S17) can be carried out by an interpolation and an extrapolation substantially in the same way as in S14. The interpolation and the extrapolation are not detailed not to repeat their explanation.

D) Temperature correction is performed, based on a temperature estimation result of S13 and a result of the error estimation in S16 (S18).

Corrected estimated temperatures T″ can be given by adding estimation errors ΔT to estimated temperatures T′ of the wafers by the adder 140 as the corrector as expressed by Formulae (28) and (29).

$$Tic''=Tic'+\Delta Tic (i=1-5) \quad (28)$$

$$Tie''=Tie'+\Delta Tie (i=1-5) \quad (29)$$

Resultantly, temperatures of the wafers can be more correctly estimated.

(E) The heater is controlled based on corrected estimated temperatures T″ (S19).

The heater controller 160 compares corrected estimated temperatures T″ with a set temperature Tsp to determined suitable heat powers P1′–P5′ to the heaters 31–35.

For example, powers of the heaters 31–35 can be determined corresponding to differences between corrected estimated temperatures T″ and a set temperature Tsp. This control is made corresponding to a computation period ts determined by the computation period determining unit 170.

(Other Embodiments)

The above-described embodiments of the present invention can be expanded and modified in the scope of the technical idea of the present invention.

The heat treatment apparatus according to the present invention does not essentially include both of the computation period determining unit and the temperature estimator, and may include either of them. For example, the computation period determining unit can be used to actually meter wafer temperatures, and in this case, the temperature control is effectively performed, based on computation periods determined by the computation period determining unit.

The model is not essentially the parameter model expressed by Formula (5) and may be other suitable models. Dimensions of the model are not essentially 16 and may be 8, 20 or others.

The heater may not be divided and is not essentially divided in 5 sections.

The heat treatment apparatus according to the present invention is not essentially a vertical heat treatment apparatus or of the batch-type, and may be of sheet-type for making a heat treatment on wafers sheet by sheet.

As described above, according to the present invention, temperatures of objects-to-be-processed can be estimated with good accuracy.

What is claimed is:

1. A heat treatment apparatus comprising:
a heater for heating an object-to-be-processed;
a temperature meter disposed in the heater;
a temperature estimator for computing an estimated temperature of the object-to-be-processed, based on a temperature metered result of the temperature meter;
an error estimator for computing an estimation error of the estimated temperature computed by the temperature estimator;
a temperature corrector for computing a corrected estimated temperature given by correcting the estimated temperature computed by the temperature estimator, based on the estimation error computed by the error estimator; and
a heating controller for controlling the heater, based on the corrected estimated temperature computed by the temperature corrector, and a temperature recipe stating a relationship between a set temperature and a time.

2. A heat treatment apparatus comprising:
a heater for heating an object-to-be-processed;
a temperature meter disposed in the heater;
a temperature estimator for computing an estimated temperature of the object-to-be-processed, based on a temperature metered result of the temperature meter;
an error estimator for computing an estimation error of the estimated temperature computed by the temperature estimator;
a temperature corrector for computing a corrected estimated temperature given by correcting the estimated temperature computed by the temperature estimator, based on the estimation error computed by the error estimator;
a heating controller for controlling the heater, based on the corrected estimated temperature computed by the temperature corrector, and a temperature recipe stating a relationship between a set temperature and a time; and
a computation period determining unit for determining a computation period for periodically computing the estimated temperature by the temperature estimator and the estimation error by the error estimator.

3. The heat treatment apparatus according to claim 2, wherein
the computation period determining unit determines the computation period corresponding to an absolute value of a change rate of the set temperature.

4. The heat treatment apparatus according to claim 2, wherein
the computation period determined by the computation period determining unit is an integer time a shortest computation period.

5. The heat treatment apparatus according to claim 4, wherein
the temperature estimator includes a data interpolator for interpolating data for computing the estimated temperature when the computation period determined by the computation period determining unit is different from the shortest computation period.

6. The heat treatment apparatus according to claim 4, wherein
the error estimator includes a data interpolator for interpolating data for computing the estimation error when the computation period determined by the computation period determining unit is different from the shortest computation period.

7. The heat treatment apparatus according to claim 1, wherein
the temperature meter includes a heater vicinity temperature meter for metering a temperature of a heater vicinity, and an object-to-be-processed vicinity temperature meter for metering a temperature of an object-to-be-processed vicinity, and the temperature estimator computes the estimated temperature of the object-to-be-processed, based on a control signal for electric power to be fed to the heater, the heater vicinity temperature metered by the heater vicinity temperature meter, and the object-to-be-processed vicinity temperature metered by the object-to-be-processed vicinity temperature meter.

8. The heat treatment apparatus according to claim 7, wherein the temperature estimator computes an estimated temperature of the object-to-be-processed vicinity, based on the control signal for electric power to be fed to the heater, and the temperature of the heater vicinity metered by the heater vicinity temperature meter, and the error estimator computes the estimation error, based on the temperature of the object-to-be-processed vicinity given by the object-to-be-processed vicinity temperature meter, the estimated temperature of the object-to-be-processed vicinity computed by the temperature estimator, and the temperature change rate of the set temperature.

9. A controller for controlling a heat treatment apparatus comprising a heater for heating an object-to-be-processed, and temperature meter disposed in the heater, the controller comprising:

a temperature estimator for computing an estimated temperature of the object-to-be-processed, based on a temperature metering result of the temperature meter;

an error estimator for computing an estimation error of the estimated temperature computed by the temperature estimator;

a temperature corrector for computing a corrected estimated temperature given by correcting the estimated temperature computed by the temperature estimator, based on the estimation error computed by the error estimator; and a heating controller for controlling the heater, based on the corrected estimated temperature computed by the temperature corrector.

10. A controller for controlling a heat treatment apparatus comprising a heater for heating an object-to-be-processed, and a temperature meter disposed in the heater, the controller comprising:

a temperature estimator for computing an estimated temperature of the object-to-be-processed, based on a temperature metering result of the temperature meter;

an error estimator for computing an estimation error of the estimated temperature computed by the temperature estimator;

a temperature corrector for computing a corrected estimated temperature given by correcting the estimated temperature computed by the temperature estimator, based on the estimation error computed by the error estimator;

a heating controller for controlling the heater, based on the corrected estimated temperature computed by the temperature corrector; and a computation period determining unit for determining a computation period for periodically computing the estimated temperature by the temperature estimator and the estimation error by the error estimator.

11. The controller for controlling a heat treatment apparatus according to claim 10, wherein the computation period determining unit determines the computation period corresponding to an absolute value of a change rate of a set temperature.

12. The controller for controlling a heat treatment apparatus according to claim 10, wherein the computation period determined by the computation period determining unit is an integer time shortest computation period.

13. The controller for controlling a heat treatment apparatus according to claim 12, wherein the temperature estimator includes a data interpolator for interpolating data for computing the estimated temperature when the computation period determined by the computation period determining unit is different from the shortest computation period.

14. The controller for controlling a heat treatment apparatus according to claim 12, wherein the error estimator includes a data interpolator for interpolating data for computing the estimation error when the computation period determined by the computation period determining unit is different from the shortest computation period.

15. A controller for controlling a heat treatment apparatus comprising a heater for heating an object-to-be-processed, the controller comprising:

a heating controller for controlling the heater in accordance with a temperature recipe stating a relationship between a set temperature and a time; and a control period determining unit for determining a control period for periodically controlling the heater by the heating controller, based on a change rate of the set temperature.

16. A method for controlling a heat treatment apparatus comprising a heater for heating an object-to-be-processed, the method comprising:

a temperature metering step of metering a temperature in the heater;

a temperature estimating step of computing an estimated temperature of the object-to-be-processed, based on a temperature metering result of the temperature metering step;

an error estimating step of computing an estimation error of the estimated temperature computed in the temperature estimating step;

a temperature correcting step of computing a corrected estimated temperature given by correcting the estimated temperature computed in the temperature estimating step, based on the estimation error computed in the error estimation step; and a heating control step for controlling the heater, based on the corrected estimated temperature computed in the temperature correcting step, and a temperature recipe stating a relation ship between a set temperature and a time.

17. A method for controlling a heat treatment apparatus comprising a heater for heating an object-to-be-processed, the method comprising:

a temperature metering step of metering a temperature in the heater;

a temperature estimating step of computing an estimated temperature of the object-to-be-processed, based on a temperature metering result of the temperature metering step;

an error estimating step of computing an estimation error of the estimated temperature computed in the temperature estimating step;

a temperature correcting step of computing a corrected estimated temperature given by correcting the estimated temperature computed in the temperature estimating step, based on the estimation error computed in the error estimation step;

a heating control step for controlling the heater, based on the corrected estimated temperature computed in the temperature correcting step, and a temperature recipe stating a relationship between a set temperature and a time; and a computation period determining step of determining a computation period for periodically computing the estimated temperature in the temperature estimating step and the estimation error computed in the error estimating step.

18. The method for controlling a heat treatment apparatus according to claim 17, wherein the computation period determining step is for determining the computation period corresponding to an absolute value of a change rate of the set temperature.

19. The method for controlling a heat treatment apparatus according to claim 17, wherein the computation period determined in the computation period determining step is an integer time shortest computation period.

20. The method for controlling a heat treatment apparatus according to claim 19, wherein the temperature estimating step includes a data interpolating step of interpolating data for computing the estimated temperature when the computation period determined in the computation period determining step is different from the shortest computation period.

21. The method for controlling a heat treatment apparatus according to claim 19, wherein the error estimating step includes a data interpolating step of interpolating data for computing the estimation error when the computation period determined in the computation period determining step is different from the shortest computation period.

22. The method for controlling a heat treatment apparatus according to claim 16, wherein the temperature estimating step includes a heater vicinity temperature estimating step of metering a temperature of the heater vicinity, and an object-to-be-processed vicinity temperature metering step of metering a temperature of the object-to-be-processed vicinity, the temperature estimating step is for computing the estimated temperature of the object-to-be-processed, based on a control signal for electric power to be fed to the heater, the temperature of the heater vicinity metered in the heater vicinity temperature metering step, and the temperature of the object-to-be-processed vicinity metered in the object-to-be-processed vicinity temperature metering step.

23. The method for controlling a heat treatment apparatus according to claim 22, wherein the temperature estimating step is for computing the estimated temperature of the object-to-be-processed vicinity, based on a control signal for electric power to be fed to the heater, and the temperature of the heater vicinity metered in the heater vicinity temperature metering step, and the error estimating step is for computing the estimation error, based on the temperature of the object-to-be-processed vicinity metered in the object-to-be-processed vicinity temperature metering step, and the estimated temperature of the object-to-be-processed vicinity computed in the temperature estimating step, and a temperature change rate of the set temperature.

24. A method for controlling a heat treatment apparatus comprising:

a heating control step of controlling the heater in accordance with a temperature recipe stating a relationship between a set temperature and a time; and a control period determining step of determining a control period for periodically controlling the heater by the heating control step, based on a change rate of the set temperature.

* * * * *

UNITED STATES PATENT AND TRADEMARK OFFICE
CERTIFICATE OF CORRECTION

PATENT NO. : 6,847,015 B2  Page 1 of 1
APPLICATION NO. : 09/963381
DATED : January 25, 2005
INVENTOR(S) : Wenling Wang et al.

It is certified that error appears in the above-identified patent and that said Letters Patent is hereby corrected as shown below:

Title page, item, please insert

--(73)  Inventors:  Wenling Wang, Tokyo-To (JP)
Koichi Sakamoto, Tokyo-To (JP)
Youngchul Park, Tokyo-To (JP)
Fujio Suzuki, Tokyo-To (JP)
Sunil Shah, California (US)
Pradeep Pandey, California (US)--

Signed and Sealed this

Fifth Day of September, 2006

JON W. DUDAS
*Director of the United States Patent and Trademark Office*